(12) United States Patent
De Wit et al.

(10) Patent No.: US 8,723,606 B2
(45) Date of Patent: May 13, 2014

(54) GAIN ENHANCEMENT CIRCUIT AND METHOD

(76) Inventors: Yannick De Wit, Aartselaar (BE); Ishwar Chandra Mudegowdar, Antwerp (BE); Genis Chapinal, Antwerp (BE)

( * ) Notice: Subject to any disclaimer, the term of this patent is extended or adjusted under 35 U.S.C. 154(b) by 59 days.

(21) Appl. No.: 13/396,123

(22) Filed: Feb. 14, 2012

(65) Prior Publication Data

US 2012/0206202 A1    Aug. 16, 2012

Related U.S. Application Data

(60) Provisional application No. 61/443,698, filed on Feb. 16, 2011.

(51) Int. Cl.
*H03F 3/08* (2006.01)

(52) U.S. Cl.
USPC .............................................. 330/308; 330/51

(58) Field of Classification Search
USPC .......... 330/51, 278, 308; 250/214 A, 214 AG
See application file for complete search history.

(56) References Cited

U.S. PATENT DOCUMENTS

| | | | |
|---|---|---|---|
| 5,625,210 A | 4/1997 | Lee et al. | |
| 6,566,697 B1 | 5/2003 | Fox et al. | |
| 6,803,555 B1 * | 10/2004 | Parrish et al. | 330/308 |
| 7,414,464 B2 * | 8/2008 | Lin | 330/51 |
| 7,459,982 B2 * | 12/2008 | Miao | 330/308 |
| 7,750,958 B1 | 7/2010 | Dierickx | |
| 7,830,436 B2 * | 11/2010 | Sumi et al. | 348/300 |
| 8,217,328 B2 * | 7/2012 | Yin et al. | 250/214 A |
| 2009/0101798 A1 * | 4/2009 | Yadid-Pecht et al. | 250/214 A |

* cited by examiner

*Primary Examiner* — Khanh V Nguyen
(74) *Attorney, Agent, or Firm* — Rennie William Dover

(57) ABSTRACT

In accordance with an embodiment, a gain enhancement circuit includes an amplifier having an input terminal, a transistor coupled to the input terminal and a capacitance dynamically coupled to another input terminal of the amplifier by a switch, wherein the capacitance is a parasitic element of the transistor.

18 Claims, 4 Drawing Sheets

GAIN ENHANCEMENT CIRCUIT AND METHOD

This application claims benefit to U.S. Provisional Patent Application 61/443,698, filed Feb. 16, 2011, and titled "Pixel With Bootstrapped Reset Gate-Source Capacitance" by Yannick De Wit et al.

BACKGROUND

The present invention relates, in general, to electronics and, more particularly, to gain enhancement in electronic circuits.

In the past, the electronics industry used solid-state image sensors to form pixels in camera systems. The pixels were configured into an array of rows and columns and contained photosensitive elements. Image sensors are disclosed in U.S. Pat. No. 5,625,210 issued to Paul P. Lee et al. on Apr. 29, 1997, U.S. Pat. No. 6,566,697 B1 issued to Eric C. Fox et al. on May 20, 2003, and U.S. Pat. No. 7,750,958 B1 issued to Bart Dierickx on Jul. 6, 2010. A drawback with these systems is low conversion gain, mismatches in capacitance which causes photo response nonuniformity (PRNU) and fixed pattern noise (FPN). In addition, circuitry added to increase the conversion gain increases the noise and reduces the bandwidth of the output signal.

Accordingly, it would be advantageous to have a gain enhancement circuit and a method for enhancing gain with a reduced increase in noise and a reduced bandwidth reduction. It is desirable for the method and circuit to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
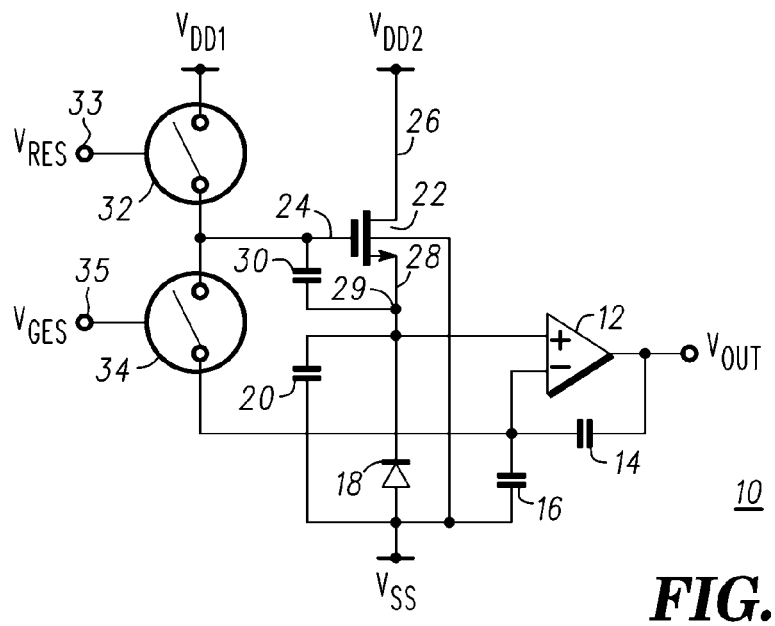
FIG. 1 is a circuit schematic of a gain enhancement circuit in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain N-channel or P-channel devices, or certain N-type or P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

It should be noted that a logic zero voltage level ($V_L$) is also referred to as a logic low voltage and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic zero voltage level may be about 0.8 volts, whereas for a five volt CMOS system, the logic zero voltage level may be about 1.5 volts. A logic one voltage level ($V_H$) is also referred to as a logic high voltage level and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

Generally the present invention provides a gain enhancement circuit and a method for increasing the gain of a circuit such as, for example, the conversion gain of a pixel. In accordance with an embodiment, a pixel may include a gain stage comprised of an operational amplifier having an input terminal commonly coupled to a reset transistor and a detector such as, for example, a photodiode, and an input terminal coupled in a feedback configuration with the output terminal of the operational amplifier. By way of example, the reset transistor may be a field effect transistor having a drain electrode, a source electrode, and a gate electrode. As discussed above, the drain and source electrodes may be referred to as current carrying electrodes and the gate electrode may be referred to as a control electrode. An input terminal of the operational amplifier is commonly connected to a cathode of the photodiode and the source electrode of the reset transistor and the other input terminal of the operational amplifier is connected to the output terminal of the operational amplifier in a negative feedback configuration. The conversion gain (CG) of the gain stage may be given by equation (EQT) 1 as $$CG = A_{CL}/C_{effective} \qquad \text{EQT 1}$$

where:

CG is the conversion gain of the circuit with units of Volts per electron;

$A_{CL}$ is the closed loop gain of the operational amplifier; and $C_{effective}$ is the effective capacitance of the gain stage.

The effective capacitance of the gain stage such as, for example, a gain stage comprising the reset transistor and the operational amplifier includes the gate-to-source capacitance of the reset transistor, a diffusion capacitance of the photodiode, and the input capacitance of the amplifier as shown by EQT 2:

$$C_{effective} = Cpd + C_{gs} + Cin_{amp} \qquad \text{EQT. 2}$$

where:

Cpd is the diffusion capacitance associated with the photodiode;

$C_{gs}$ is the capacitance between the gate electrode and the source electrode of the reset transistor; and $Cin_{amp}$ is the input capacitance of the operational amplifier.

These capacitances represent parasitic capacitances in the gain stage. Although the gain stage has been described as including a field effect transistor, this is not a limitation of the present invention. For example, a bipolar transistor can be used in place of a field effect transistor, the field effect transistor can be a junction field effect transistor, etc. Combining equations 1 and 2 illustrates that the gain of the gain structure can be increased by decreasing one or more of the capacitance values of EQT. 2.

In accordance with an embodiment, switches are coupled to the reset transistor and the amplifier and toggled to place the capacitance $C_{gs}$ across an input terminal the operational amplifier. Because circuit elements such as, for example, switches are used to couple and decouple capacitance $C_{gs}$ to the operational amplifier, capacitance $C_{gs}$ may be referred to as being dynamically or switchably coupled to the amplifier. In this configuration, the voltage at the gate electrode of the reset transistor follows the voltage at its source electrode during the integration time, thereby inhibiting the accumulation of extra charge on the gate-to-source capacitance of the reset transistor during the integration time. The effective capacitance becomes the sum of the photodiode diffusion capacitance Cpd and the input capacitance of the amplifier $Cin_{amp}$. Because this decreases the denominator of the gain equation, the gain is increased.

In accordance with another embodiment, additional switches are included to set the voltages at the gate electrode, the drain electrode, and the source electrode to be substantially equal to preclude the formation of a drain-to-source leakage path. The switches are operated such that the gate electrode is switchably or dynamically coupled to the drain electrode and the drain electrode is switchably or dynamically decoupled from a source of operating potential during the integration time.

In accordance with another embodiment, the operational amplifier is replaced with a transistor configured as a source follower amplifier. The transistor includes a gate electrode and source and drain electrodes, wherein the gate electrode is coupled to the source electrode of the reset transistor and to the cathode of the photodiode. The gate electrode of the reset transistor is switchably or dynamically coupled to the source electrode of the source follower amplifier, which serves as the output terminal of the source follower amplifier.

FIG. 1 is a circuit schematic of a gain enhancement circuit 10 in accordance with an embodiment of the present invention. Gain enhancement circuit 10 includes an operational amplifier 12 having an inverting input terminal, a noninverting input terminal, and an output terminal. An energy storage element 14 such as, for example, a capacitor is connected between the inverting input terminal and the output terminal of operational amplifier 12 and an energy storage element 16 such as, for example, a capacitor is coupled between the inverting input terminal of operational amplifier 12 and a source of operating potential $V_{SS}$. By way of example, source of operating potential $V_{SS}$ is a ground potential. A photodiode 18 having an anode and a cathode is connected between the noninverting input terminal of operational amplifier 12 and source of operating potential $V_{SS}$. Photodiode 18 may be a partial pinned photodiode capable of being fully depleted at a depletion voltage $V_{PIN}$. A parasitic capacitance 20 is formed between the noninverting input terminal of operational amplifier 12 and source of operating potential $V_{SS}$. Parasitic capacitance 20 represents the capacitance associated with photodiode 18. A transistor 22 having a control electrode 24 and current carrying electrodes 26 and 28 is connected to the noninverting input terminal of operational amplifier 12, photodiode 18, and parasitic capacitance 20. More particularly, current carrying electrode 26 is coupled for receiving a source of operating potential $V_{DD2}$ and current carrying electrode 28 is connected to the noninverting input terminal of operational amplifier 12 to form a detection node 29. A parasitic gate-to-source capacitance 30 is formed between control electrode 24 and current carrying electrode 28. Thus, parasitic gate-to-source capacitance 30 is formed between control electrode 24 and the noninverting input terminal of operational amplifier 12. It should be noted that capacitances 20 and 30 are parasitic capacitances whereas circuit elements 14 and 16 are non-parasitic capacitors that form a feedback network with operational amplifier 12. A switch 32 is connected between a source of operating potential $V_{DD1}$ and control electrode 24 and a switch 34 is connected between control electrode 24 and the inverting input terminal of operational amplifier 12. In accordance with an embodiment, operating potential $V_{DD1}$ may be selected to be greater than operating potential $V_{DD2}$ to set the potential at gate electrode 24 to be greater than the potential at drain electrode 26 so that reset transistor 22 enters a hard reset state. It should be noted that the level of operating potential VDD1 is not a limitation and that it can be selected to provide a hard-soft reset scheme or other suitable reset schemes. Switch 32 has a control terminal 33 which is coupled for receiving a signal $V_{RES}$ to open and close switch 32 and switch 34 has a control terminal 35 which is coupled for receiving a gain enhancement signal $V_{GES}$ to open and close switch 34.

Figure 2:
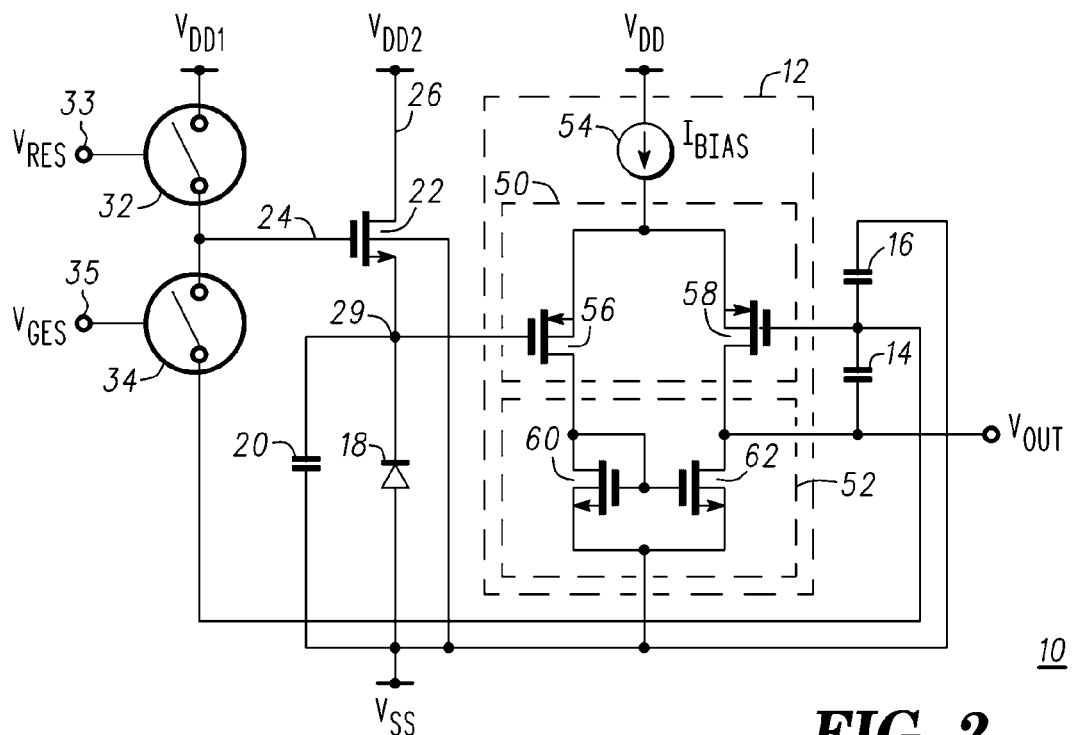
FIG. 2 is a circuit schematic of a portion of the gain enhancement circuit of FIG. 1 in accordance with an embodiment of the present invention.

FIG. 2 is a circuit schematic of gain enhancement circuit 10 including a circuit schematic of operational amplifier 12 in accordance with an embodiment of the present invention. Operational amplifier 12 includes an input stage 50 coupled to a current mirror 52 and a bias current source 54 that outputs a current $I_{BIAS}$. Input stage 50 may be comprised of a pair of transistors 56 and 58 coupled in a differential configuration. For example, transistors 56 and 58 may be p-channel transistors, wherein each transistor has a gate electrode, a source electrode, and a drain electrode. The source electrodes of transistors 56 and 58 are commonly connected together and to current source 54 and the drain electrodes of transistors 56 and 58 are connected to current mirror 52.

Current mirror 52 may include a pair of n-channel transistors 60 and 62, where each transistor 60 and 62 has a gate electrode, a source electrode, and a drain electrode. The source electrodes of transistors 60 and 62 are commonly connected together and for receiving source of operating potential $V_{SS}$. The gate electrodes of transistors 60 and 62 are commonly connected together and to the drain electrode of transistor 60. The drain electrode of transistor 60 is connected to the drain electrode of transistor 56 and the drain electrode of transistor 62 is connected to the drain electrode of field effect transistor 58, wherein the commonly connected drain electrodes of transistors 58 and 62 serve as the output terminal of operational amplifier 12. It should be appreciated that the configuration of operational amplifier 12 is not limited to that shown in FIG. 2 and that other suitable operational amplifier configurations can be used.

Figure 3:
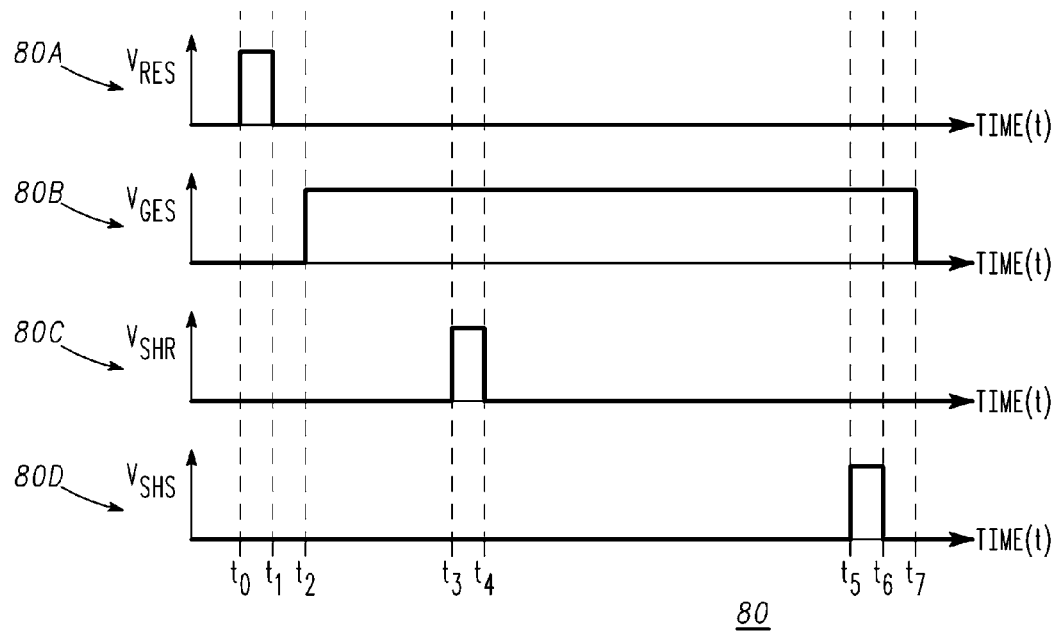
FIG. 3 is a timing diagram in accordance with an embodiment of the present invention.

FIG. 3 is a timing diagram 80 that includes plots 80A, 80B, 80C, and 80D, illustrating a method for increasing the gain of a gain stage in accordance with embodiments of the present invention. Plots 80A, 80B, 80C, and 80D illustrate reset voltage $V_{RES}$ for resetting transistor 22, gain enhancement signal $V_{GES}$, sample/hold reset signal $V_{SHR}$, and sample/hold signal $V_{SHS}$ over time (t). Before time $t_0$, voltages $V_{RES}$, $V_{GES}$, $V_{SHR}$, and $V_{SHS}$ are at logic low voltage levels. Thus, source of operating potential $V_{DD1}$ is disconnected from gate electrode 24 of transistor 22. At time $t_0$, reset voltage $V_{RES}$ transitions to a logic high voltage level, which voltage level is applied to control electrode 33 and closes switch 32. In response to switch 32 being closed, voltage $V_{DD1}$ is applied to gate electrode 24, turning on transistor 22 and resetting detection node 29. At time $t_1$, reset voltage $V_{RES}$ transitions to a logic low voltage level, which opens switch 32 and turns off reset transistor 22.

At time $t_2$, gain enhancement signal $V_{GES}$ transitions to a logic high voltage level at input terminal 35 of switch 34. In response to gain enhancement signal $V_{GES}$ transitioning to a logic high voltage level, switch 34 closes thereby connecting gate electrode 24 to the inverting input terminal of amplifier 12. Thus, closing switch 34 connects a terminal of parasitic capacitance 30 to the inverting input terminal of operational amplifier 12. The other terminal of parasitic capacitance 30 is connected to the noninverting input terminal of operational amplifier 12.

At time $t_3$, sample/hold reset signal $V_{SHR}$ transitions to a logic high voltage level to sample the reset voltage at detection node 29 in preparation for beginning the integration time and at time $t_4$ sample/hold reset signal $V_{SHR}$ transitions to a logic low voltage level, which begins the integration time. Because parasitic capacitance 30, i.e., the gate-to-source capacitance of transistor 22 is coupled to the input terminals of operational amplifier 12, the voltage at the gate electrode of reset transistor 22 follows the voltage at its source electrode during the integration time. As those skilled in the art are aware, an operational amplifier functions to set the voltages at its inverting and noninverting input terminals to be substantially the same when configured in a negative feedback configuration. As described above, configuring gain enhancement circuit 10 so that source electrode 28 follows gate electrode 24 during the integration time reduces the effective capacitance of gain enhancement circuit 10 which increases the conversion gain of circuit 10.

At time $t_5$, sample/hold reset signal $V_{SHS}$ transitions to a logic high voltage level in preparation for ending the integration time and at time $t_6$ sample/hold reset signal $V_{SHS}$ transitions to a logic low voltage level, which substantially ends the integration time.

At time $t_7$, gain enhancement signal $V_{GES}$ transitions to a logic low voltage level at control terminal 35 of switch 34. In response to gain enhancement signal $V_{GES}$ transitioning to a logic low voltage level, switch 34 opens thereby disconnecting parasitic capacitance 30 from the noninverting input terminal of operational amplifier 12.

Figure 4:
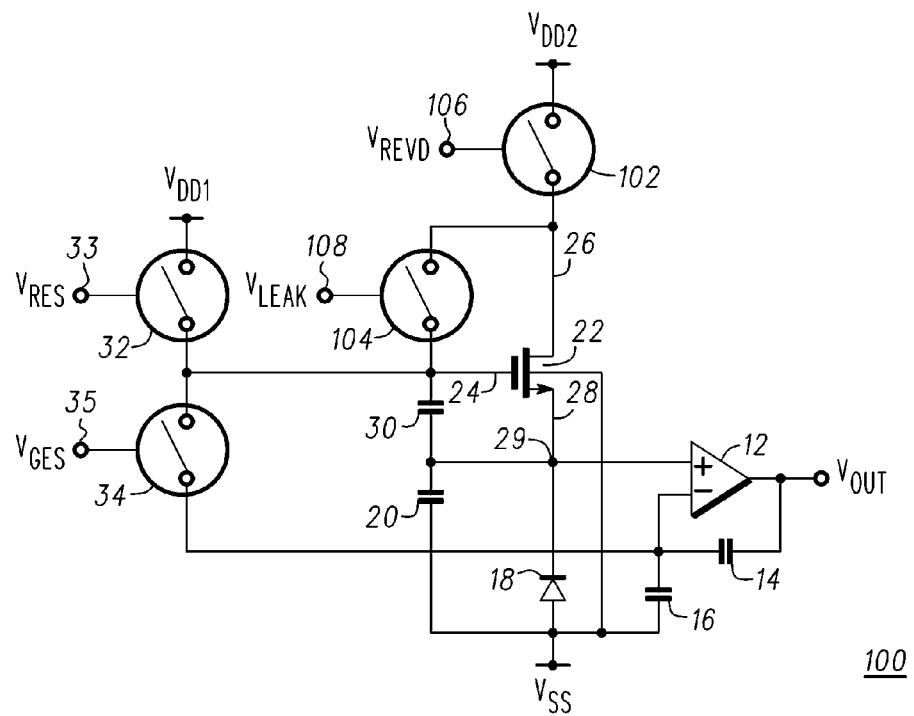
FIG. 4 is a circuit schematic of a gain enhancement circuit in accordance with an embodiment of the present invention.

FIG. 4 is a circuit schematic of a gain enhancement circuit 100 in accordance with an embodiment of the present invention. Like gain enhancement circuit 10, gain enhancement circuit 100 includes operational amplifier 12, capacitors 14 and 16, photodiode 18, parasitic capacitance 20, transistor 22, parasitic gate-to-source capacitance 30, and switches 32 and 34. In addition, gain enhancement circuit 100 includes a switch 102 coupled between drain electrode 26 of transistor 22 and source of operating potential $V_{DD2}$ and a switch 104 coupled between gate electrode 24 and drain electrode 26 of transistor 22. Switch 102 has a control terminal 106 coupled for receiving a voltage $V_{REVD}$ and switch 104 has a control terminal 108 coupled for receiving a voltage $V_{LEAK}$.

Figure 5:
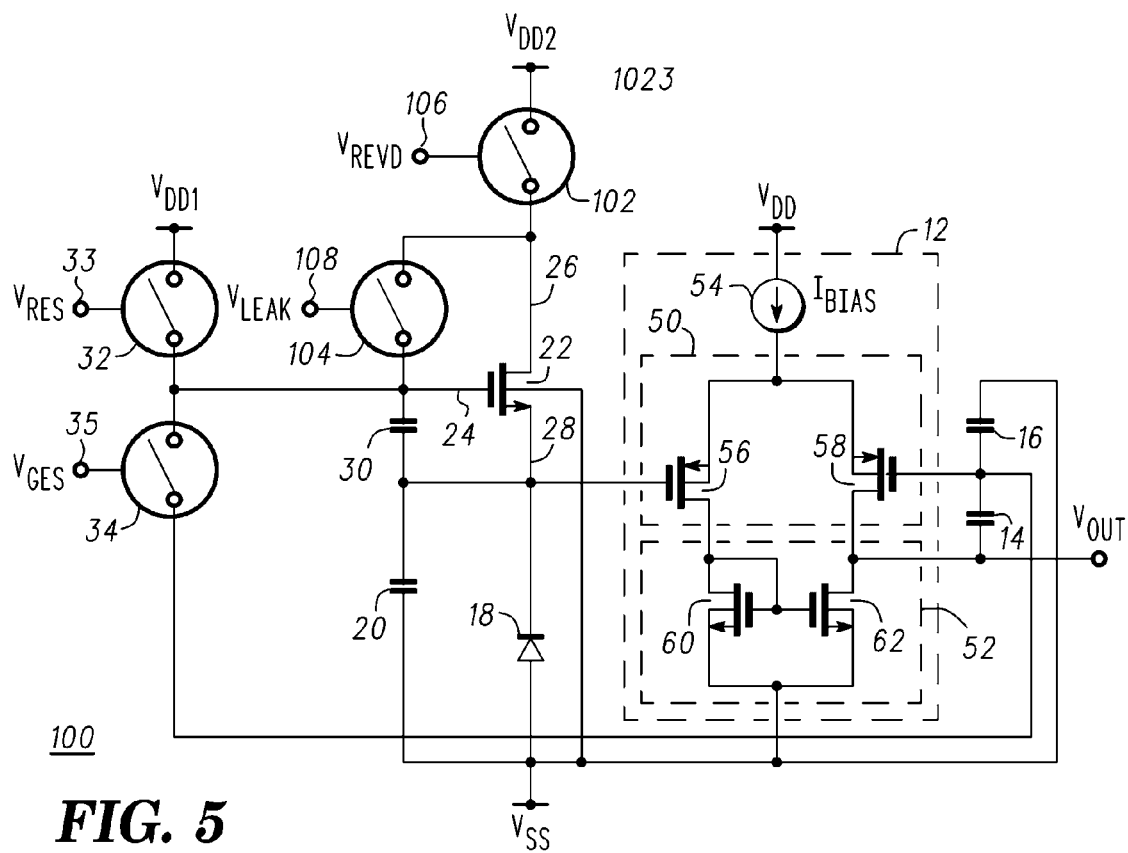
FIG. 5 is a circuit schematic of a portion of the gain enhancement circuit of FIG. 4 in accordance with an embodiment of the present invention.

FIG. 5 is a circuit schematic of gain enhancement circuit 100 further including a circuit schematic of operational amplifier 12 in accordance with an embodiment of the present invention. Operational amplifier 12 has been described with reference to FIG. 2.

Figure 6:
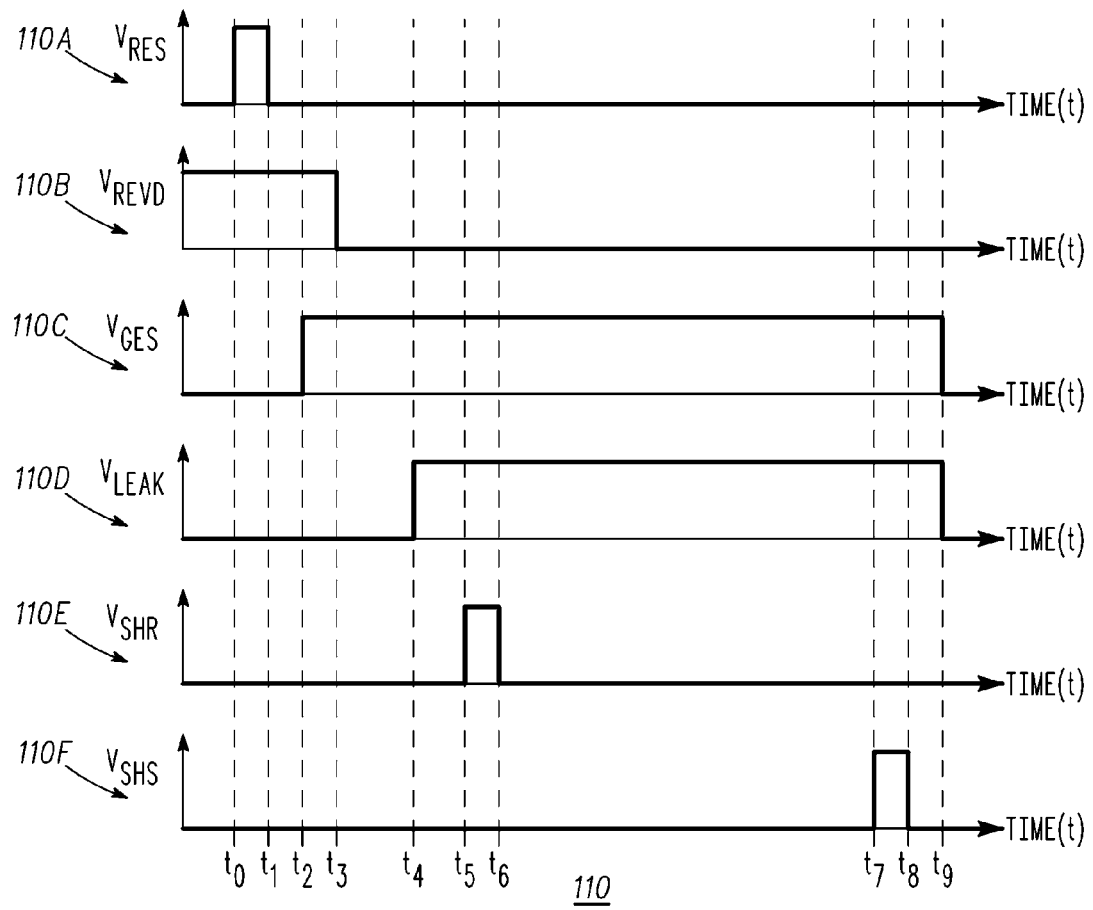
FIG. 6 is a timing diagram in accordance with another embodiment of the present invention.

FIG. 6 is a timing diagram 110 that includes plots 110A, 110B, 110C, 110D, 110E, and 110F illustrating a method for increasing the gain of a gain stage in accordance with embodiments of the present invention. Plots 110A, 110B, 110C, 110D, 110E, and 110F illustrate reset voltage $V_{RES}$ for resetting transistor 22, actuating voltage $V_{REVD}$ for opening and closing switch 102, gain enhancement signal $V_{GES}$, leakage current reduction signal $V_{LEAK}$, sample/hold reset signal $V_{SHR}$, and sample/hold signal $V_{SHS}$ over time (t). Before time $t_0$, voltages $V_{RES}$, $V_{LEAK}$, $V_{GES}$, $V_{SHR}$, and $V_{SHS}$ are at logic low voltage levels and voltage $V_{REVD}$ is at a logic high voltage level. At time $t_0$, reset voltage $V_{RES}$ transitions to a logic high voltage level, which voltage level is applied to control electrode 33 closes switch 32. In response to being closed, voltage $V_{DD1}$ is applied to gate electrode 24, turning on reset transistor 22 and resetting photodiode 18 and parasitic capacitance 20 before dynamically coupling parasitic capacitance 30 to the inverting input terminal of amplifier 12. At time $t_1$, reset voltage $V_{RES}$ transitions to a logic low voltage level, which opens switch 32.

At time $t_2$, a gain enhancement signal $V_{GES}$ transitions to a logic high voltage level which is applied to control terminal 35 of switch 34. In response to gain enhancement signal $V_{GES}$, switch 34 closes thereby connecting one terminal of parasitic capacitance 30 to the inverting input terminal of operational amplifier 12. The other terminal of parasitic capacitance 30 is connected to the noninverting input terminal of operational amplifier 12.

At time $t_3$, voltage $V_{REVD}$ transitions to a logic zero voltage level which disconnects drain electrode 26 of transistor 22 from source of operating potential $V_{DD2}$.

At time $t_4$, in response to voltage $V_{LEAK}$ transitioning to a logic high voltage level, switch 104 closes shorting gate electrode 24 and drain electrode 26 of reset transistor 22 together and setting the voltages at gate electrode 24, drain electrode 26, and source electrode 28 substantially equal to each other, which inhibits formation of a current leakage path between these electrodes. As discussed above an operational amplifier functions to set the voltages at its inverting and noninverting input terminals to be substantially the same when configured in a negative feedback configuration. Thus, the voltages at gate electrode 24, drain electrode 26, and source electrode 28 are substantially equal.

At time $t_5$, sample/hold reset signal $V_{SHR}$ transitions to a logic high voltage level in preparation for beginning the integration time and at time $t_6$ sample/hold reset signal $V_{SHR}$ transitions to a logic low voltage level, which begins the integration time. Configuring gain enhancement circuit 100 so that the source electrode follows the gate electrode during the integration time reduces the capacitance of gain enhancement circuit 100 which increases the conversion gain of circuit 100.

At time $t_7$, sample/hold reset signal $V_{SHS}$ transitions to a logic high voltage level in preparation for ending the integration time and at time $t_8$ sample/hold reset signal $V_{SHS}$ transitions to a logic low voltage level, which ends the integration time and samples the signal voltage.

At time $t_9$, signals $V_{GES}$ and $V_{LEAK}$ appearing at terminals 35 and 108, respectively, transition to logic low voltage levels. In response to the logic low voltage levels, switch 34 opens disconnecting parasitic capacitance 30 from the non-inverting input terminal of operational amplifier 12 and switch 104 opens disconnecting gate electrode 24 from drain electrode 26 of transistor 22.

Figure 7:
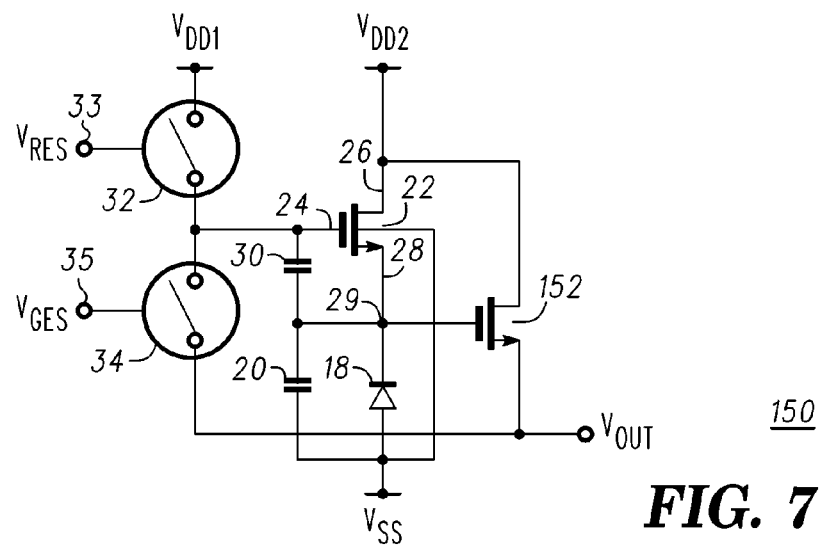
FIG. 7 is a circuit schematic of a gain enhancement circuit in accordance with another embodiment of the present invention.

FIG. 7 is a circuit schematic of a gain enhancement circuit 150 in accordance with another embodiment of the present invention. Like gain enhancement circuit 10, gain enhancement circuit 150 includes photodiode 18, parasitic capacitance 20, transistor 22, parasitic gate-to-source capacitance 30, and switches 32 and 34. In place of operational amplifier 12, gain enhancement circuit 150 includes a transistor 152 configured as a source follower having a gate electrode coupled to source electrode 28 of transistor 22 to form detection node 29, a drain electrode coupled for receiving source of operating potential $V_{DD2}$, and a source electrode connected to switch 34. The source electrode of transistor 152 serves as an output terminal for transmitting an output signal $V_{OUT}$. It should be noted that the loading of source follower 152 can be accomplished using, for example, a current source, a pulsed precharge circuit, or the like.

Figure 8:
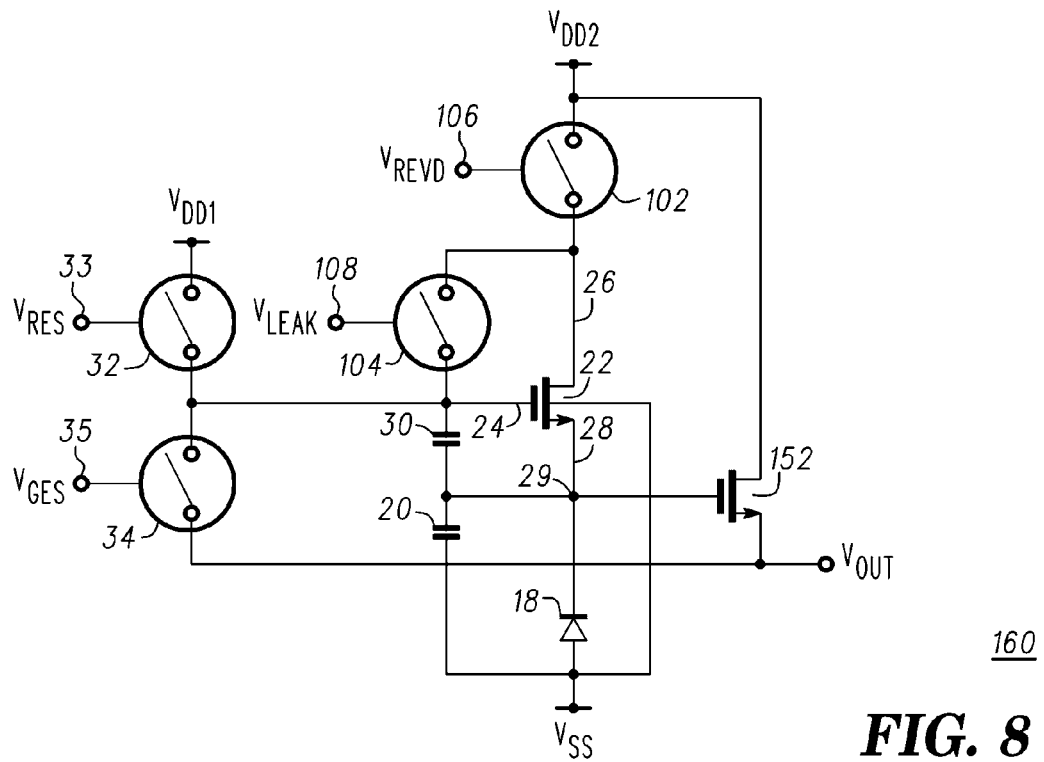
FIG. 8 is a circuit schematic of a gain enhancement circuit in accordance with another embodiment of the present invention.

FIG. 8 is a circuit schematic of a gain enhancement circuit 160 in accordance with another embodiment of the present invention. Like gain enhancement circuit 150, gain enhancement circuit 160 includes field effect transistor 152 configured as a source follower amplifier, photodiode 18, parasitic capacitance 20, transistor 22, parasitic gate-to-source capacitance 30, and switches 32 and 34. In addition, gain enhancement circuit 160 includes switch 102 coupled between drain electrode 26 of transistor 22 and source of operating potential $V_{DD2}$ and switch 104 coupled between gate electrode 24 and drain electrode 26 of transistor 22. Switch 102 has a control terminal 106 coupled for receiving voltage $V_{REVD}$ and switch 104 has a control terminal 108 coupled for receiving voltage $V_{LEAK}$. It should be noted that the loading of source follower transistor 152 can be accomplished using, for example, a current source, a pulsed precharge circuit, or the like.

By now it should be appreciated that a gain enhancement circuit and method have been provided. In accordance with embodiments, the capacitance of a gain enhancement circuit is decreased which increases the gain of the circuit.

Although specific embodiments have been disclosed herein, it is not intended that the invention be limited to the disclosed embodiments. Those skilled in the art will recognize that modifications and variations can be made without departing from the spirit of the invention. For example, the present invention is not limited to embodiments including photodiodes. Embodiments may include gain enhancement circuits having configurations without photodiodes. Although detectors have been described as photodiodes which are capable of detecting light and generating electrons from the detected light, this is not a limitation of the present invention. For example, the detector may be a pressure detector, a chemical detector, etc. It is intended that the invention encompass all such modifications and variations as fall within the scope of the appended claims.

What is claimed is:

1. A gain enhancement circuit, comprising:
a first transistor having a control electrode and first and second current carrying electrodes;
an amplifier having at least one input terminal and an output terminal, a first input terminal of the at least one input terminal coupled to the first current carrying electrode of the first transistor to form a detection node, wherein the amplifier comprises an operational amplifier having a noninverting input terminal, an inverting input terminal, and an output terminal, the noninverting input terminal serving as the first input terminal of the amplifier;
a first switch having a control terminal and first and second terminals, the first terminal coupled to the control electrode of the first transistor; and
a second switch having a control terminal and first and second terminals, the first terminal coupled to the control electrode of the first transistor.

2. The gain enhancement circuit of claim 1, further comprising a first energy storage element having first and second terminals, the first terminal of the first energy storage element coupled to the inverting input terminal of the amplifier.

3. The gain enhancement circuit of claim 2, further comprising a second energy storage element having first and second terminals, the first terminal of the second energy storage element coupled to the inverting input terminal of the amplifier.

4. The gain enhancement circuit of claim 3, further including a stimulus detector coupled to the detection node.

5. The gain enhancement circuit of claim 4, wherein the stimulus detector is a photodiode.

6. The gain enhancement circuit of claim 4, further including a third switch having a control terminal and first and second terminals, the first terminal coupled to the second current carrying electrode of the first transistor and the second terminal coupled to the control electrode of the first transistor.

7. The gain enhancement circuit of claim 6, further including a fourth switch having a control terminal and first and second terminals, the first terminal coupled to the first terminal of the third switch and to the second current carrying electrode of the first transistor.

8. The gain enhancement circuit of claim 4, further including a third switch having a control terminal and first and second terminals, the first terminal coupled to the second current carrying electrode of the first transistor.

9. A gain enhancement circuit, comprising:
a first transistor having a control electrode and first and second current carrying electrodes;
an amplifier having at least one input terminal and an output terminal, a first input terminal of the at least one input terminal coupled to the first current carrying electrode of the first transistor to form a detection node, wherein the amplifier comprises a second transistor having a control electrode and first and second current carrying electrodes, the second transistor configured as a source follower and the control electrode of the second transistor serving as the first input terminal of the amplifier;
a first switch having a control terminal and first and second terminals, the first terminal coupled to the control electrode of the first transistor; and
a second switch having a control terminal and first and second terminals, the first terminal coupled to the control electrode of the first transistor.

10. The gain enhancement circuit of claim 9, further including a photodiode coupled to the detection node.

11. The gain enhancement circuit of claim 10, wherein the second terminal of the second switch is coupled to the first current carrying electrode of the second transistor.

12. The gain enhancement circuit of claim 10, further including a third switch having a control terminal and first and second terminals, the first terminal coupled to the second current carrying electrode of the first transistor.

13. A method for increasing gain of a circuit, comprising dynamically coupling a first parasitic capacitance to a first input terminal of an amplifier, wherein dynamically coupling the first parasitic capacitance to the first input terminal of the amplifier includes coupling a first electrode of the first parasitic capacitance to a first current carrying electrode of a first transistor, wherein the second electrode of the first parasitic capacitance is coupled to a control electrode of the first transistor, wherein dynamically coupling the first parasitic capacitance to the first input terminal of the amplifier further includes closing a first switch to couple a terminal of the first parasitic capacitance to the first input terminal of the amplifier.

14. The method of claim 13, wherein dynamically coupling the first parasitic capacitance to the first input terminal of the amplifier includes coupling a first electrode of the first parasitic capacitance to an inverting input terminal of the amplifier through the first switch, wherein a second electrode of the first parasitic capacitance is coupled to a noninverting input terminal of the amplifier.

15. The method of claim 13, further including resetting a second parasitic capacitance before dynamically coupling the first parasitic capacitance to the first input terminal of the amplifier.

16. The gain enhancement structure of claim 12, further including a fourth switch having a control terminal and first and second terminals, the first terminal coupled to the second current carrying electrode of the first transistor and the second terminal coupled to the control electrode of the first transistor, wherein the second current carrying electrode of the fourth switch is coupled for receiving a source of operating potential.

17. The method of claim 13, further including inhibiting a drain electrode to source electrode leakage current from a transistor coupled to the amplifier by closing a second switch to couple a gate electrode of the transistor to its drain electrode.

18. The method of claim 17, further including using a third switch to couple the drain electrode of the transistor for receiving a source of operating potential.

* * * * *